United States Patent [19]
Tang et al.

[11] Patent Number: 5,721,438
[45] Date of Patent: Feb. 24, 1998

[54] HETEROJUNCTION SEMICONDUCTOR DEVICE AND METHOD OF MANUFACTURE

[75] Inventors: Zhirong Tang; Jenny M. Ford, both of Mesa; John W. Steele, Chandler, all of Ariz.

[73] Assignee: Motorola, Inc., Schaumburg, Ill.

[21] Appl. No.: 593,306

[22] Filed: Jan. 31, 1996

[51] Int. Cl.$^6$ ............... H01L 31/0328; H01L 31/0336
[52] U.S. Cl. ............................. 257/197; 257/198
[58] Field of Search ........................ 257/197, 198, 257/587, 592, 593; 437/126, 31

[56] References Cited

U.S. PATENT DOCUMENTS

| | | | |
|---|---|---|---|
| 5,302,841 | 4/1994 | Yamazaki | 257/197 |
| 5,358,895 | 10/1994 | Steele et al. | 437/80 |
| 5,496,746 | 3/1996 | Matthews | 437/31 |
| 5,508,537 | 4/1996 | Imai | 257/197 |
| 5,512,496 | 4/1996 | Chan et al. | 437/31 |

*Primary Examiner*—Wael Fahmy
*Assistant Examiner*—Fetsum Abraham
*Attorney, Agent, or Firm*—Bruce T. Neel

[57] ABSTRACT

A heterojunction bipolar transistor (HBT) (30) is formed to have a germanium composition profile (46) in a base region (32) that improves the tolerance of the HBT device (30) to manufacturing variations and reduces the sensitivity to emitter/base biases. A first region (40) of essentially constant germanium composition is formed at the interface of an emitter region (34) and the base region (32). The germanium composition profile (46) also has a second region (41) in which the germanium composition is increased linearly to provide an acceleration field by reducing the band gap in this second region (41). The acceleration field reduces the transit time of carriers and increases the frequency response of the HBT device (30).

26 Claims, 3 Drawing Sheets

HETEROJUNCTION SEMICONDUCTOR DEVICE AND METHOD OF MANUFACTURE

BACKGROUND OF THE INVENTION

This invention relates, in general, to semiconductor devices, and more particularly to the composition of the materials used in heterojunction semiconductor devices.

Heterojunction Bipolar Transistors (HBTs) are similar to conventional Bipolar Junction Transistors (BJTs) in that they both have a collector terminal, a base terminal, and an emitter terminal. They also produce similar terminal current behavior when the operating conditions are applied. One difference between HBTs and BJTs is that while the BJT has a base region composed of a single homogeneous semiconductor material, for example silicon, the heterojunction (HBT) device has a base region which includes more than one semiconductor material, for example silicon with germanium. The presence of the germanium in the base region alters the band gap of the semiconductor in the base region, which results in modified performance characteristics of the semiconductor device.

This general principle of band gap engineering can be used to enhance the performance characteristics of the semiconductor device. The frequency performance of the bipolar transistor can be improved by varying the composition of the non-homogeneous base material within the base region. For example, with a base region composed of an alloy of silicon and germanium, if the amount of germanium is larger at the collector side of the base than at the emitter side of the base, the band gap is smaller at the collector side than at the emitter side of the base. This band gap gradient will create an accelerating field which will reduce the transit time of an electron through the base region. This acceleration will improve the overall frequency and switching speed of the heterojunction bipolar transistor compared to the response of a comparable bipolar junction transistor.

The composition gradient in the non-homogenous base of an HBT does present some manufacturing difficulties. Any junction formed between N and P type semiconductor materials has a depletion region surrounding it. This depletion region is a volume of semiconductor material depleted of carriers, and having a built-in field. In heterojunction bipolar transistors, the composition of the base material at the depletion edge of the emitter to base junction plays a significant role in determining the performance of the device. Variations in the base material composition at this location, as well as the doping levels of N-type dopant in the emitter or P-type dopant in the base, will change parameters such as gain and frequency response. There are many sources of variation which could result in a different composition of base material being present at the edge of the emitter to base depletion region.

For example, the thickness of the emitter and base regions can vary the impurity dopant profile, allowing the edge of the emitter to base depletion region to fall on a region of the base with a different non-homogeneous base composition. If the emitter is polysilicon, variation of the grain size can modify the diffusion rate of dopants and vary the impurity dopant profile. The impurity profile can also be affected by variations in the thermal cycles seen by the devices throughout the manufacturing process. Variations in high temperature processes can vary the amount of dopant which is electrically active, and vary the diffusion rate of the dopants. In addition, the profile of the non-homogeneous base region may also vary from the specification. All of these sources of variation are cumulative, and can create site to site variation in the position of the edge of the emitter to base depletion region within the base composition profile.

The profile of the composition of the base region itself is also a source of variation once the HBT is operated under electrical bias. As a voltage potential varies across the emitter and base terminals, the depletion region varies in width. As width of this depletion region is modulated with bias, the edge of the depletion region on the base side will fall on regions of the non-homogeneous base region with different composition. Therefore, the performance of the HBT will vary with the operational conditions.

By now it should be appreciated that it would be advantageous to provide a method for improving the manufacturability of heterojunction bipolar transistors. It would also be advantageous if the method could reliably form HBTs with performance characteristics which are less variable with the operating conditions. It would be of further advantage if the method could be used to intentionally vary the performance of an HBT to meet the requirements of varying customer demands and do so without additional manufacturing expense.

DETAILED DESCRIPTION OF THE DRAWINGS

The present invention is directed towards providing a method for forming a heterojunction bipolar transistor (HBT) that is more manufacturable than traditional HBT devices. To make the manufacturing process more robust, the material composition profile in the base region is specially designed to not only produce an HBT that has the desired properties, but the material composition profile also allows the HBT to tolerate processing and operational variations. The present invention also provides a method for adjusting the material composition profile to adjust the gain and frequency response of the heterojunction semiconductor device.

Figure 1:
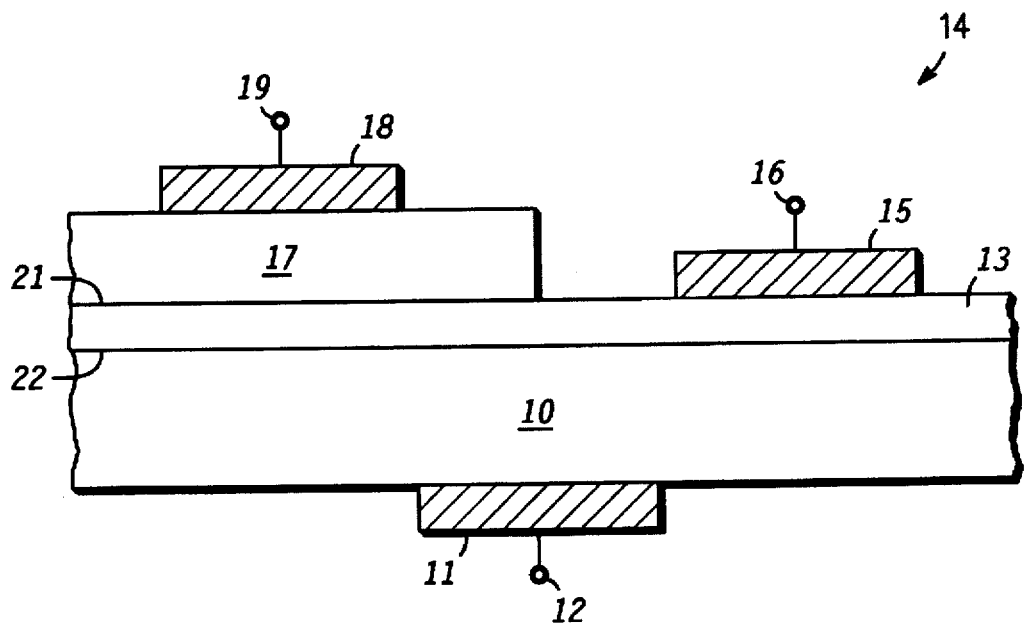
FIG. 1 is an enlarged cross-sectional view of a previously known HBT structure.

Referring now to FIG. 1, a previously known HBT structure 14 is provided to further underscore the differences between the prior art and the present invention. HBT structure 14 is a traditional bipolar device having an emitter terminal 19, a base terminal 16, and a collector terminal 12. HBT structure 14 is formed using a semiconductor substrate, which acts as a collector region 10. On a surface 22 of collector region 10, a base region 13 is formed by growing a layer of epitaxial silicon. On a surface 21 of base region 13, an emitter region 17 is formed by depositing a layer of polysilicon. Electrical contact is made to collector region 10, base region 13, and emitter region 17 with metal regions 11, 15, and 18 to provide collector terminal 12, base terminal 16, and emitter terminal 19 respectively.

To provide the necessary electrical properties, each of the three regions 10, 13, and 17 are doped to the proper conductivity. For example, if HBT structure 14 is an NPN device, then collector region 10 would be doped n-type, base region 13 would be doped p-type, and emitter region 17 would be doped n-type. To further enhance the performance of HBT structure 14, base region 13 may include more than one material that is intended to reduce the band gap across base region 13. One common base material that is used to accomplish band gap engineering is silicon-germanium.

Figure 2:
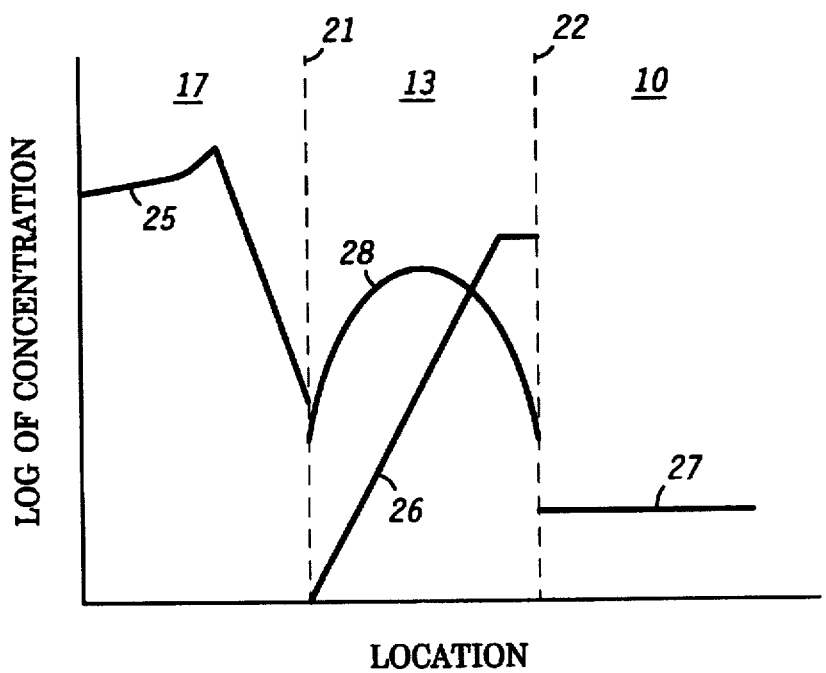
FIG. 2 is a graph showing a dopant concentration and material composition profiles throughout the HBT structure of FIG. 1.

FIG. 2 is provided to show the relative dopant concentrations in each of regions 10, 13, and 17 and to further illustrate how a germanium composition in the base region can be used to enhance the performance of an HBT. The graph is a plot of the log of concentration along the y-axis versus the relative location or position in each of regions 10, 13, and 17. The origin represents a top surface of emitter region 17 and the rightmost point is an arbitrary surface of collector region 10. The interface between emitter region 17 and base region 13 is shown as surface 21 and the interface between base region 13 and collector region 10 is shown as surface 22. A line 25 shows the relative concentration of n-type dopant, such as arsenic, across emitter region 17. A line 28 shows the relative concentration of p-type dopant, such as boron, across base region 13. A line 27 shows the relative concentration of n-type dopant, such as arsenic or phosphorus, across collector region 10. In addition, a line 26 shows the relative germanium composition in the silicon of base region 13.

As shown in FIG. 2, the germanium concentration, line 26, begins at zero at the emitter/base interface, surface 21, and increases linearly through most of base region 13. One factor that determines the performance of HBT structure 14 is the depletion region (not shown) that forms around surface 21. The width of this depletion region is dependent on the dopant concentrations of emitter region 17 and base region 13. As can be seen in the graph of FIG. 2, the germanium composition value of base region 13 close to the emitter/base interface can vary greatly due to the sloped profile of the germanium composition, line 26. Slight variations in the doping profile of the dopants in emitter region 17 and base region 13 will cause variation in the location and width of the depletion region surrounding the emitter/base interface. This variation, plus the sloped profile of the germanium composition near the emitter/base interface, is what is responsible for making the controlled manufacture of such HBT devices very difficult. It is quite common to see the variation in gain of a batch of HBT devices to vary 50% due to the above mentioned variation and the slope of the germanium profile.

As will be shown in more detail below, the present invention addresses this problem by forming a foot region of constant germanium composition at the interface between the emitter and base regions. This region of substantially constant composition will allow the edge of the depletion region surrounding the emitter/base interface to extend into the base region, yet intersect the germanium composition profile at a constant, and predictable germanium composition value. Therefore, an HBT device can be fabricated that has the desired characteristics using a manufacturing process that has a reduced variability from one HBT device to the next.

Figure 3:
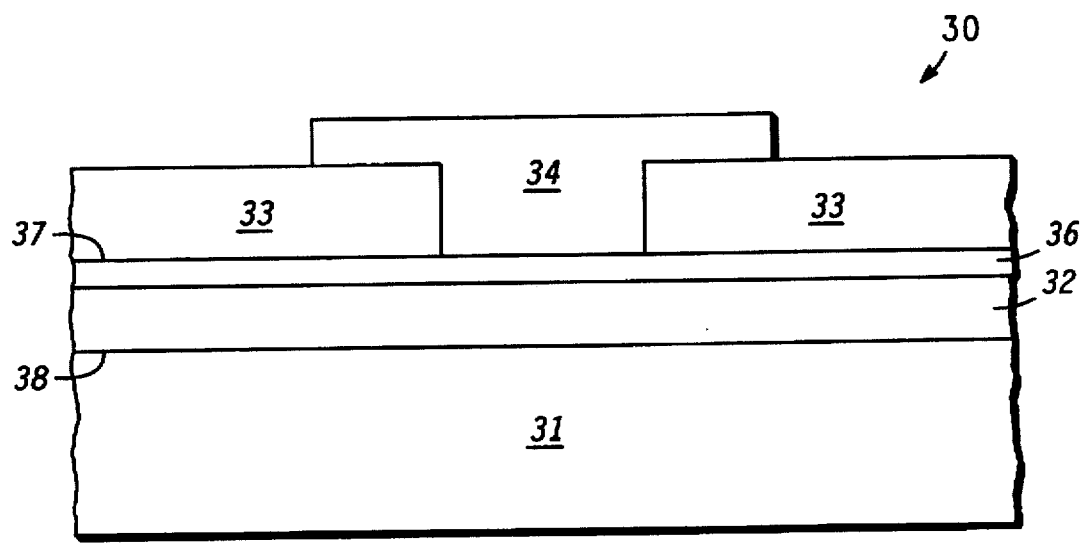
FIG. 3 is an enlarged cross-sectional view of an HBT structure according the present invention.

For a further explanation of the present invention, refer to FIG. 3, which is a cross-sectional view of an HBT device 30 in one particular configuration. It will be appreciated by one skilled in the art that the methods and embodiments of the present invention are not limited to the configuration shown in FIG. 3 or to the materials used in the following examples. HBT device 30 comprises a collector region 31, which can be made from an epitaxial layer on a semiconductor substrate. A base region 32 is formed on a surface 38 of collector region 31. Base region 32 is preferably formed from an epitaxial silicon process and has a germanium composition profile, which will be described in more detail below. A cap layer 36 of silicon may be optionally formed on base region 32 to improve the quality of a surface 37 of base region 32 as will be explained shortly. HBT device 30 further comprises a dielectric layer 33 that is used to provide electrical isolation between an emitter region 34 and base region 32

Figure 4:
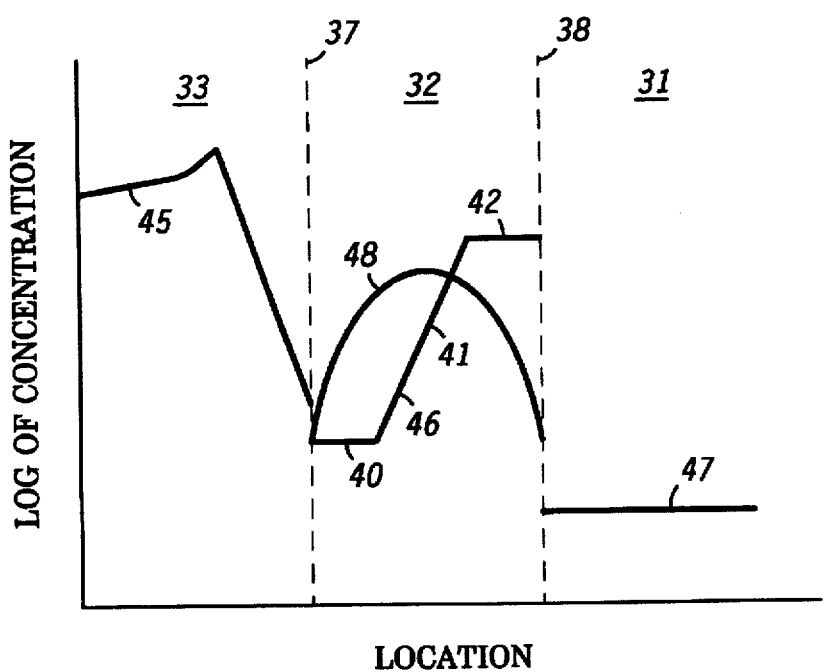
FIG. 4 is a graph showing a dopant concentration and material composition profiles throughout the HBT structure according the present invention.

Base region 32 has a germanium composition profile that improves the manufacturability of HBT device 30 when compared to the previously known methods for forming HBT structures. FIG. 4 is provided to illustrate the germanium composition and to further highlight the differences between the present invention and the previously known HBT structure 14 of FIG. 1. FIG. 4 is similar to FIG. 2 except the dopant concentration of emitter region 34 is shown as a line 45, the dopant concentration of base region 32 is shown as a line 48, the dopant concentration of the collector region 31 is shown as a line 47, and the germanium composition profile of base region 32 is shown as a line 46.

Line 46 has three regions. A first region 40 is the area near the interface between emitter region 34 and base region 32. According to the present invention, a foot or substantially constant germanium composition profile is formed in first region 40. This is in contrast to a sloped germanium composition profile of prior HBT structures. The constant germanium composition of first region 40 allows the dopant concentrations of emitter region 34 and base region 32 to shift, yet there will be the same value of composition of germanium where the depletion region intersects the germanium composition profile of first region 40. In other words, if line 45 and 48 shift due to manufacturing variability, they will still intersect the germanium composition profile, line 46, at essentially the same value. When a bias is applied to HBT device 30 between emitter region 34 and base region 32 a depletion region (not shown) will be formed across the emitter/base interface. The constant germanium composition profile of first region 40 reduces the gain sensitivity of HBT device 30 to emitter/base bias since the edge of the depletion region in base region 32 will always intersect the same germanium composition value as the bias across the emitter/base region changes.

The germanium composition profile, line 46, also has a second region 41 that is characterized as a sloped line that changes linearly across this portion of base region 32. The increasing germanium composition in second region 41 will cause the band gap to change across second region 41 and will create an acceleration field for electrons. Since the germanium composition profile increases linearly across this region, the band gap will be proportionately decreasing as well. An electric field will thus be created to assist the electrons and reduce the transit time of electrons across base region 32. This in turn will improve the frequency response of HBT device 30. Second region 41 terminates at a third region 42 where the germanium composition is once again essentially constant. It should be understood that HBT device 30 can be formed such that second region 41 extends all the way to collector region 31 so that there is no third region 42.

Figure 5:
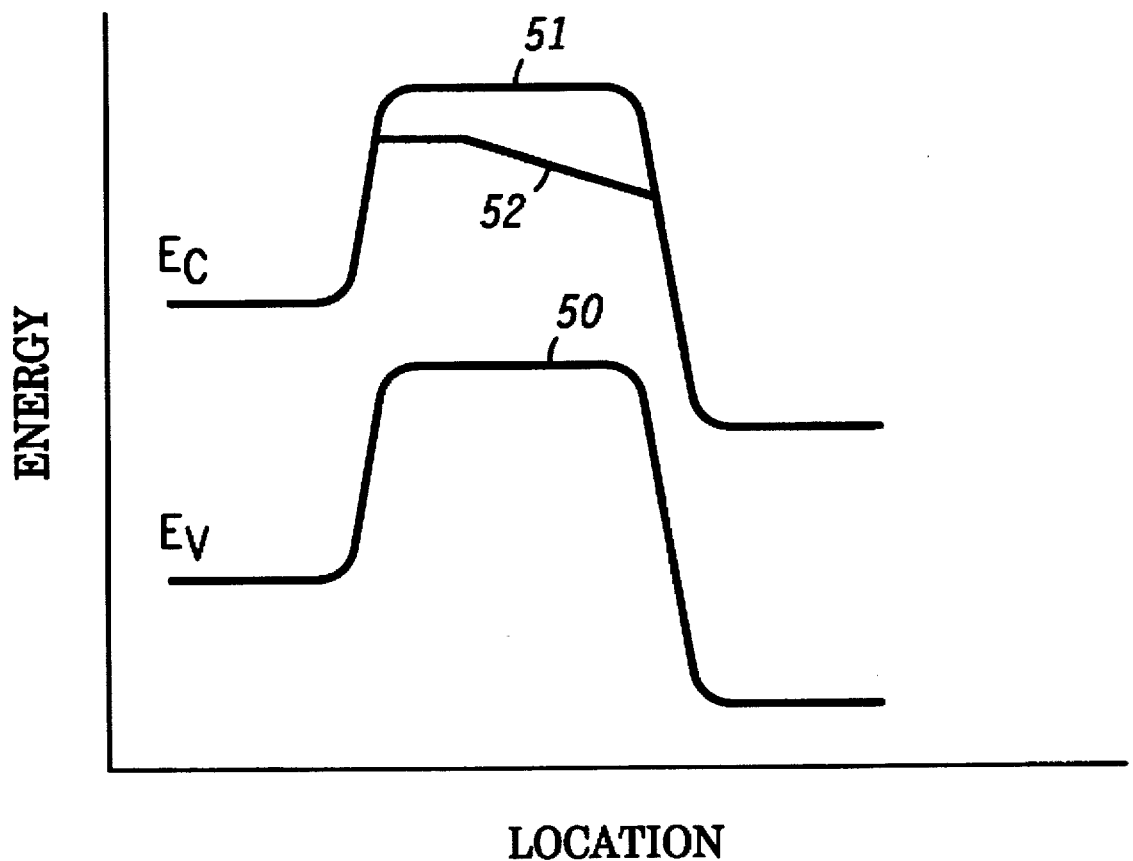
FIG. 5 is an energy band diagram comparing the band gap of the HBT structure according the present invention against the band gap of the previously known BJT structure.

FIG. 5 is a band gap diagram and is provided to further illustrate the differences between an HBT device according to the present invention and prior BJT structures. The y-axis of the graph is the amount of energy in electron volts. Ev is the valance band, Ec is the conduction band, and the difference between Ec and Ev represents the band gap for a particular material. The x-axis represents the three regions of a bipolar device, the emitter region, base region, and collector region. A line 50 is shown to represent the valance band of various bipolar devices having the same physical configuration. A line 51 is shown to represent the conduction band of the base region of a previously known BJT device that has a base region made only of silicon. A line 52 is shown to represent the conduction band of HBT device 30 having a germanium composition profile illustrated in FIG. 4. Line 52 has a uniform portion in the base region that corresponds to the constant germanium composition profile of first region 40. Line 52 then decreases linearly, which represents the linearly increasing germanium composition of second region 41. Therefore, the present invention is able to adjust the band gap of base region 32 so that the optimal gain and frequency response can be obtained.

A method for forming a heterojunction semiconductor device according to the present invention will now be provided using FIGS. 3 and 4 for reference. Again, in the following example it should be understood that alternative configurations could be formed and some materials could be substituted to produce an HBT device having essentially the same characteristics. In this example an NPN device is formed. However, it should be understood that a PNP device could be formed by changing n-type regions to p-type and vice versa. To begin, collector region 31 is provided using an n-type semiconductor substrate, or by doping an intrinsic silicon substrate, epitaxial silicon layer, or a layer of float zone material.

To form base region 32, preferably an epitaxial growth process is used in an epitaxial reactor. The total thickness of base region 32 is about 200 angstroms to 8000 angstroms and can be formed using a single recipe that adjusts the composition of germanium incorporated into the silicon crystal at various points through base region 32. For example, base region 32 can be formed by first growing a layer of single crystal silicon about 50 angstroms to 5000 angstroms thick to provide a lattice pattern to be replicated by the rest of base region 32. A germanium source gas is then added to the reaction chamber to form third region 42, which is about 5 angstroms to 1000 angstroms thick and has a germanium composition of about 0.1 percent to 24 percent by weight. Again, the formation of third region 42 is optional, but the thickness of this region may actually be up to 1000 angstroms. The germanium gas is then reduced as second region 41 is deposited until it reaches the composition of first region 40, which is about 0.1 percent to 24 percent by weight. The thickness of first region 40 and second region 41 are both about 50 angstroms to 1000 angstroms thick and can be adjusted to modify the gain and frequency response of HBT device 30.

After the germanium profile is formed, a cap layer 36 of intrinsic silicon may be optionally formed on the top surface of base regions 32 to provide a transition region between base region 32 and emitter region 34. The thickness of cap layer 36 is about 5 angstroms to 500 angstroms. Cap layer 36 can be considered as a part of base region 32, which provides protection to the underlying portions of base region 32 from subsequent processing and reduces the amount of surface charge at the emitter/base interface. Base region 32 is either in-situ doped or doped after deposition with a boron source to dope base region 32 to p-type.

An additional benefit of the present invention is that the germanium composition level in first region 40 and/or third region 42 can be adjusted to reduce the overall band gap of base region 32. The germanium composition in these regions can be used to adjust the gain performance of HBT device 30 to meet the specifications required by varying customers demands. It should also be noted that the present invention does not require any additional processing steps compared to previously known processing techniques. Due to the formation of the constant composition of germanium in first region 40, tolerance to processing variation is significantly improved. HBT devices made using the embodiments of the present invention commonly have a significant improvement in variation of the gain that is five times less than the variation that can be seen with previously known HBT structures.

By now it should be appreciated that the present invention provides a method for forming an HBT device that has a germanium composition profile that improves the manufacturability of the HBT device. The formation of a constant composition of germanium at the emitter/base interface allows the HBT device to tolerate variations of other dopant profiles, variations in the thickness of the emitter and base regions, and variations in the physical characteristics of the material that is used for the base region. The present invention also provides protection against performance variation due to biases placed on the emitter and base regions. These improved manufacturing tolerances reduce the final manufacturing cost of the HBT device and can be implemented with no added processing complexity.

We claim:

1. A heterojunction semiconductor device comprising:
    a collector region having a first surface;
    a base region on the first surface, the base region comprising silicon and germanium and further having a second surface, wherein the base region has a germanium composition profile that has a first region and a second region, the first region extending from the second surface a first distance and having a first composition that is substantially constant and greater than zero, and the second region extending from the first region a second distance and having a second composition that increases from the first composition; and
    an emitter region adjacent to the second surface.

2. The heterojunction semiconductor device of claim 1 wherein the second composition has a gradient profile that increases from the first composition to a third composition, the third composition being substantially constant for a third distance from the second region.

3. The heterojunction semiconductor device of claim 2 wherein the third distance is less than 1000 angstroms.

4. The heterojunction semiconductor device of claim 1 further comprising a boron dopant profile in the base region.

5. The heterojunction semiconductor device of claim 1 wherein the first distance extends further into the base region than a depletion region between the emitter region and the base region.

6. The heterojunction semiconductor device of claim 1 wherein the first distance is about 50 angstroms to 1000 angstroms.

7. The heterojunction semiconductor device of claim 1 wherein the second distance is about 50 angstroms to 1000 angstroms.

8. The heterojunction semiconductor device of claim 1 wherein the first composition and the second composition are about 0.1 percent to 24 percent by weight.

9. The heterojunction semiconductor device of claim 1 further comprising a cap layer between the base region and the emitter region on the second surface of the base region.

10. A semiconductor device comprising:

a layer of semiconductor material of a first conductivity, the layer of semiconductor material providing an emitter terminal;

a silicon epitaxial layer of a second conductivity below the layer of semiconductor material, the silicon epitaxial layer providing a base terminal and having a germanium composition profile comprising two regions, a first region of a first composition that is substantially constant, is greater than zero, and begins at a top surface of the silicon epitaxial layer, and a second region that has a gradient profile and contacts the first region; and a semiconductor substrate of the first conductivity on a bottom surface of the silicon epitaxial layer.

11. The semiconductor device of claim 10 wherein the germanium composition profile further comprises a third region of a second composition that is substantially constant and begins at the second region and extends to the bottom surface.

12. The semiconductor device of claim 11 wherein the second composition is about 0.1 percent to 24 percent by weight.

13. The semiconductor device of claim 10 further comprising a cap layer between the silicon epitaxial layer and the layer of semiconductor material.

14. The semiconductor device of claim 10 wherein the first region extends further into the silicon epitaxial layer than a depletion region present between the silicon epitaxial layer and the layer of semiconductor material.

15. The semiconductor device of claim 10 wherein the first region of the germanium composition profile is about 50 angstroms to 1000 angstroms thick.

16. The semiconductor device of claim 11 wherein the third region of the germanium composition profile is about 5 angstroms to 1000 angstroms thick.

17. The semiconductor device of claim 10 wherein the second region of the germanium composition profile is about 50 angstroms to 1000 angstroms thick.

18. The semiconductor device of claim 10 wherein the first composition is about 0.1 percent to 24 percent by weight.

19. The semiconductor device of claim 10 wherein the germanium composition profile of the second region changes linearly in the second region.

20. A method for forming a heterojunction semiconductor device comprising the steps of:

a) providing a semiconductor substrate;

b) forming a base layer on the semiconductor substrate, the base layer having a top surface, a bottom surface, and a germanium composition profile comprising:

a first region beginning at the top surface and having a first composition that is substantially constant, and greater than zero;

a second region beginning at the bottom surface and having a second composition that is greater than the first composition; and a third region between the first region and the second region, wherein the third region begins at the first composition and ends with the second composition; and c) forming an emitter region on the top surface of the base layer.

21. The method for forming the heterojunction semiconductor device of claim 20 wherein the step of forming the base layer includes providing the first region so that the first region extends further from the top surface than a depletion region corresponding to an interface between the emitter region and the base layer.

22. The method for forming the heterojunction semiconductor device of claim 20 further comprising the step of forming a cap layer on the top surface of the base layer.

23. The method for forming the heterojunction semiconductor device of claim 20 wherein the step of forming the base layer includes doping the base layer with a boron source to make the base layer of a p-type conductivity.

24. The method for forming the heterojunction semiconductor device of claim 20 wherein the step of forming the base layer includes growing at least a portion of the base layer as epitaxial silicon.

25. The method for forming the heterojunction semiconductor device of claim 20 wherein the first region is about 50 angstroms to 1000 angstroms thick.

26. The method for forming the heterojunction semiconductor device of claim 20 wherein the first composition is about 0.1 percent to 24 percent by weight.

* * * * *